(12) United States Patent
Kelly et al.

(10) Patent No.: US 9,911,806 B2
(45) Date of Patent: Mar. 6, 2018

(54) SOLVENT-BASED OXIDATION ON GERMANIUM AND III-V COMPOUND SEMICONDUCTOR MATERIALS

(71) Applicant: Taiwan Semiconductor Manufacturing Company, Ltd., Hsin-Chu (TW)

(72) Inventors: Andrew Joseph Kelly, Hsinchu County (TW); Yusuke Oniki, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/720,407

(22) Filed: May 22, 2015

(65) Prior Publication Data

US 2016/0343605 A1 Nov. 24, 2016

(51) Int. Cl.
*H01L 21/762* (2006.01)
*H01L 29/06* (2006.01)
*H01L 29/66* (2006.01)

(52) U.S. Cl.
CPC .... *H01L 29/0653* (2013.01); *H01L 21/76224* (2013.01); *H01L 29/66795* (2013.01)

(58) Field of Classification Search
CPC ............. H01L 21/762; H01L 29/66795; H01L 29/0653
USPC ........................................................ 257/506
See application file for complete search history.

(56) References Cited

U.S. PATENT DOCUMENTS

| | | | | |
|---|---|---|---|---|
| 5,243,004 A | * | 9/1993 | Funatsu | H01B 1/122 526/256 |
| 9,054,219 B1 | * | 6/2015 | Hoffmann | H01L 21/82343 |
| 9,177,785 B1 | * | 11/2015 | Kelly | H01L 21/02236 |
| 9,355,846 B2 | * | 5/2016 | Tanaka | H01L 21/02697 |
| 2004/0262676 A1 | * | 12/2004 | Lee | H01L 29/7851 257/328 |
| 2006/0118876 A1 | * | 6/2006 | Lee | H01L 29/66795 257/365 |
| 2007/0155148 A1 | | 7/2007 | Kim | |
| 2009/0029562 A1 | * | 1/2009 | Okada | C23C 16/26 438/763 |
| 2009/0283837 A1 | * | 11/2009 | Huebinger | H01L 21/76224 257/369 |
| 2011/0303915 A1 | * | 12/2011 | Cheng | H01L 21/82341 257/48 |
| 2012/0251737 A1 | * | 10/2012 | Osaki | H01L 29/4983 427/575 |
| 2012/0326126 A1 | * | 12/2012 | Chen | H01L 29/42384 257/29 |
| 2013/0092984 A1 | * | 4/2013 | Liu | H01L 29/66795 257/288 |
| 2013/0280873 A1 | * | 10/2013 | Erben | H01L 21/02181 438/239 |

(Continued)

*Primary Examiner* — Marc Armand
*Assistant Examiner* — Sue Tang
(74) *Attorney, Agent, or Firm* — Haynes and Boone, LLP

(57) ABSTRACT

A method to provide an isolation feature over a semiconductor structure is disclosed. The method includes forming a fin structure over a semiconductor substrate, forming an oxide layer over the fin structure, wherein forming the oxide layer includes performing a wet chemical oxidation process on the fin structure with a solvent mixture, forming a dielectric layer over the oxide layer, and forming at least one isolation feature over the semiconductor structure.

12 Claims, 9 Drawing Sheets

(56) References Cited

U.S. PATENT DOCUMENTS

| | | | |
|---|---|---|---|
| 2014/0154184 A1* | 6/2014 | Sailor | A61B 5/0071 424/9.6 |
| 2014/0197456 A1* | 7/2014 | Wang | H01L 29/785 257/192 |
| 2015/0050816 A1* | 2/2015 | Bae | C25B 1/006 438/787 |

* cited by examiner

SOLVENT-BASED OXIDATION ON GERMANIUM AND III-V COMPOUND SEMICONDUCTOR MATERIALS

BACKGROUND

The semiconductor industry has progressed into nanometer technology process nodes in pursuit of higher device density, higher performance, and lower cost. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

In an example, novel semiconductor materials, including compound semiconductors, are being investigated to supplement or replace conventional silicon substrates. While these alternative semiconductor materials often possess superior electrical characteristics, just as often they possess their own sets of challenges. Accordingly, this transition to more exacting materials is one of the drivers of new fabrication processes. Therefore, although existing semiconductor fabrication process have been generally adequate, they have not proved entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
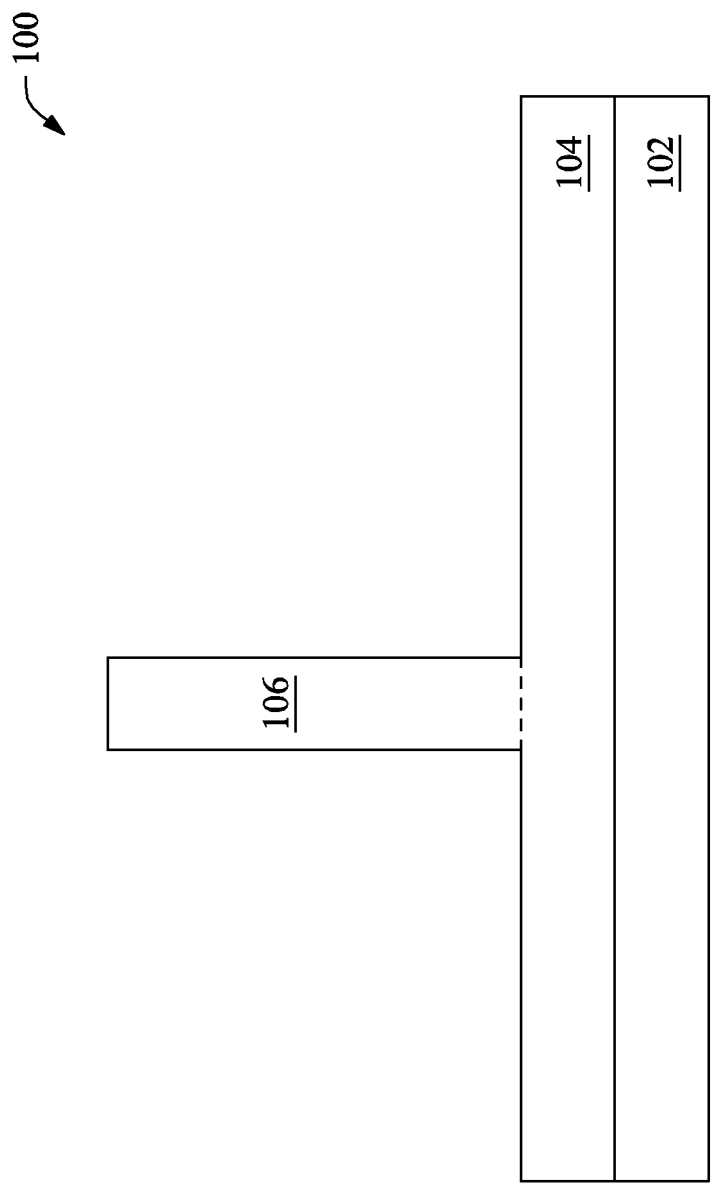
FIGS. 1A, 1B, 1C, 1D, 1E, and 1F show sectional views of a semiconductor structure at various fabrication stages constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

In semiconductor front-end process, an isolation feature (e.g., a shallow trench isolation (STI)) provides sufficient isolation between electrical devices on a semiconductor substrate. A typical STI process involves the formation of shallow trenches surrounding an active island, referred to as an "active region", on the wafer. Then, an oxide layer or a liner is formed on the interior surface of the trenches by a thermal oxidation process followed by the filling-in of the trenches with an insulating material to achieve electrical isolation effects. Typically, prior to forming such a shallow trench isolation feature (i.e. an isolation feature) on a semiconductor substrate, such as silicon substrate, an ultrathin oxide layer is formed on the substrate to provide a significant amount of hydroxyl groups and/or oxide groups on the silicon surface of the substrate. Such an ultrathin oxide layer is formed on the silicon surface by using a wet oxidation process. More specifically, the wet oxidation process may use a water-based solution such as $NH_4OH/H_2O_2/H_2O$, $O_3/H_2O$.

However, due to the introduction of using novel semiconductor materials, such as Ge, SiGe, and/or III-V semiconductor compound materials, forming an STI feature over such novel semiconductor materials may result in poor product reliability when using the same water-based solution discussed above with respect to a silicon semiconductor substrate. In an example, using the water-based solution (discussed above) to form an oxide layer on Ge surface results in an insufficient thickness of the formed oxide layer. This insufficient thickness is caused by an inherent characteristic of Ge since whenever the oxide layer (e.g., $GeO_2$) is formed, it is dissolved in such a water-based solution. In turn, any subsequent isolation feature (e.g., STI) formed on such an oxide layer with insufficient thickness is subjected to a leakage issue. In another example, forming an STI feature directly on a material layer that includes Ge may cause a diffusion of Ge atoms into the formed STI feature. The diffusion of Ge atoms may in turn from a crystalline layer between the STI feature and the Ge layer. Such a crystalline layer reduces the effectiveness of the STI feature in providing an isolation feature between active regions.

Thus, the present invention has a semiconductor structure that includes an STI feature that provides a better isolation feature and a method to fabricate said semiconductor structure when forming an STI feature over a Ge, SiGe, and/or III-V semiconductor compound materials. The disclosed methods to improve isolation features, such as STI features, is used in planer field-effect-transistors (FETs), fin FETs, vertical FETs, gate-all-around (GAA) FETs, nanowire FETs and/or other semiconductor devices. In general, the current disclosure may be applied to novel semiconductor materials, including but not limited to Ge, SiGe, and/or III-V semiconductor compound materials.

FIGS. 1A, 1B, 1C, 1D, 1E, and 1F are cross-sectional views of a semiconductor structure 100 at various fabrication stages constructed in accordance with some embodiments. The semiconductor structure 100 and the method of making the same are collectively described in accordance with some embodiments. In one embodiment, the semiconductor structure 100 includes part of one or more field effect transistors (FETs). Further, although the semiconductor structure 100 is constructed as part of a fin FET structure, in some embodiments, the disclosed method may be used to make a planer FET structure, a vertical FET structure, a gate-all-around FET structure, and/or other semiconductor devices.

Referring to FIG. 1A, the semiconductor structure 100 includes a semiconductor substrate 102. The semiconductor substrate 102 includes silicon. Alternatively, the substrate includes germanium, silicon germanium or other proper semiconductor materials such as III/V materials. In another embodiment, the semiconductor substrate 102 may include a buried dielectric material layer for isolation formed by a proper technology, such as a technology referred to as separation by implanted oxygen (SIMOX). In some embodiments, the substrate 102 may be a semiconductor on insulator, such as silicon on insulator (SOI).

As shown FIG. 1, the semiconductor structure 100 further includes a semiconductor layer 104 and a fin structure 106. In some embodiments, the layer 104 and the fin structure 106 may be formed of a same semiconductor material that is different from the material of the substrate 102. For example, the substrate 102 may be formed of silicon, and the layer 104 and the fin structure 106 may be formed of germanium, silicon-germanium compound, and/or III-V compound semiconductor material (e.g., InAs, GaAs, etc). Although the semiconductor structure 100 only includes one fin structure according to the present example shown in FIG. 1A, any number of fin structures may be formed over the substrate 102.

In accordance with various embodiments, the fin structure 106 may be formed using semiconductor fabrication processes. Such processes may include deposition, etching, photolithography, etc. In this example of FIG. 1A, the fin structure 106 is associated with a single gate device.

Figure 1B:
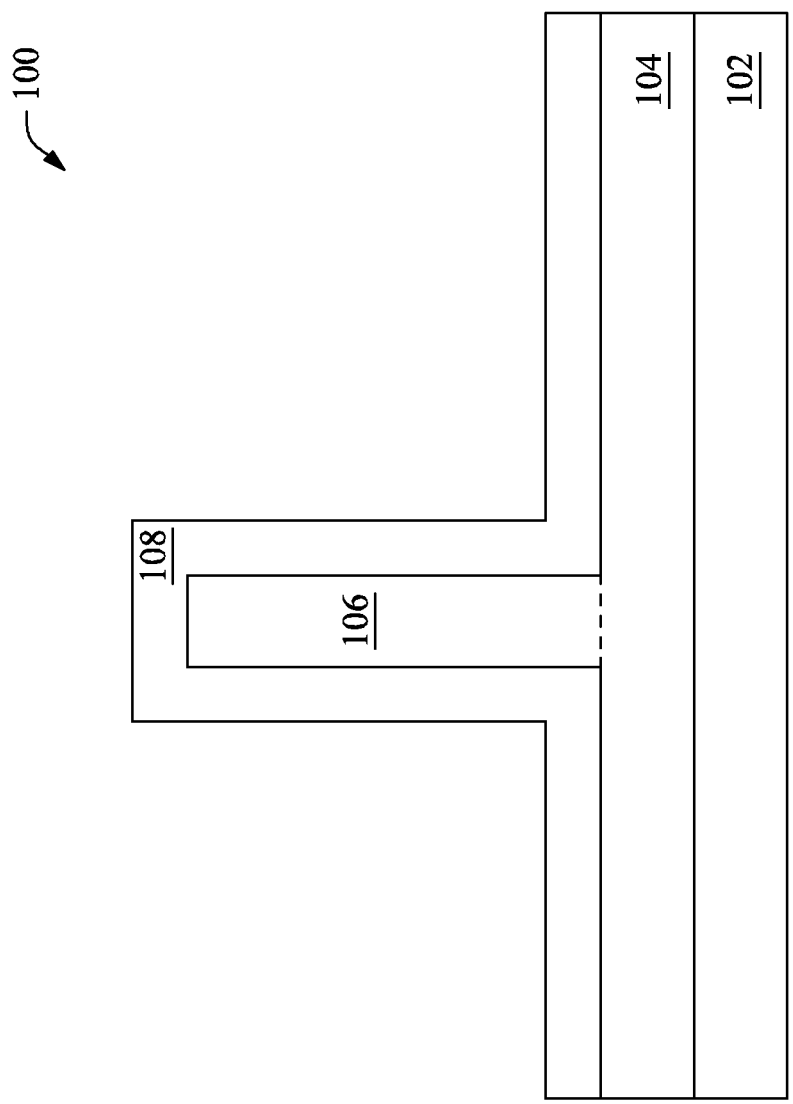

Referring to FIG. 1B, an oxide layer 108 is formed over the layer 104 and the fin structure 106. In some embodiments, the oxide layer 108 is formed by using a wet chemical oxidation operation. More specifically, the wet chemical oxidation operation includes selecting an aprotic solvent (e.g., propylene carbonate, also known as, PC) and mixing PC with a water soluble substance, thereby to form a solvent mixture. Then such a solvent mixture may be used with the layer 104 and fin structure 106 to form the oxide layer 108 over the layer 104 and the fin structure 106. The water soluble substance may include $H_2O_2$, $O_3$, $NH_4OH$, HCl, HF, $H_2SO_4$, or a combination thereof (e.g., $NH_4OH+H_2O_2$). In addition to PC, other solvents, including but not limited to dimethyl sulfoxide, ethylene carbonate or diethyl carbonate, may be used to perform such a wet oxidation operation. According to various illustrative embodiments, the oxide layer formed by the wet oxidation operation includes a thickness that is not greater than 1 nanometer (around 0.7 nanometers). Still in accordance with various embodiments, the solvent mixture comprises $H_2O$ that has concentration less than 1 weight by percentage.

Figure 1C:
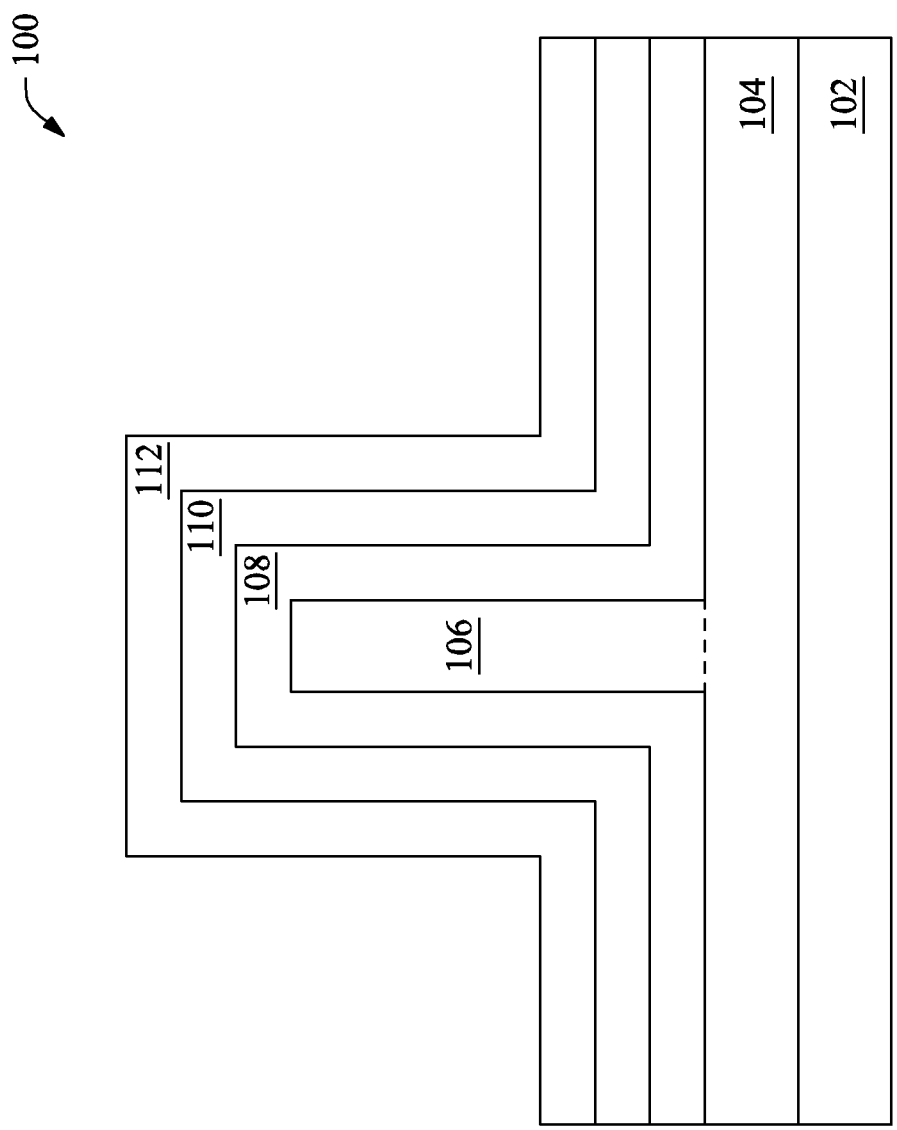

Following the formation of the oxide layer 108, in FIG. 1C, a first and a second dielectric layers 110 and 112, respectively, may be formed over the oxide layer 108. In accordance with various embodiments, the first dielectric layer 110 may include $SiO_2$, and the second dielectric layer 112 may include SiN. That is, in the present embodiment, the first and second dielectric material layers 110 and 112, respectively, are formed of different dielectric materials. However, in other embodiments, the first and second dielectric material layers 110 and 112, respectively, are formed of the same dielectric material.

The first layer 110 may be formed via atomic layer deposition (ALD) by flowing a silicon-based precursor (e.g., silanediamine ($C_8H_{22}N_2Si$)). The second layer 112 may be formed by using molecular layer deposition (MLD) by flowing a silicon-based precursor (dichlorosilane ($H_2SiCl_2$)). In accordance with various embodiments, exposure of the formed first layer 110 to the precursor molecules, dichlorosilane, results in self-limited growth of a single layer (e.g., SiN). Though the growth is self-limited, the thickness deposited during each cycle of MLD involves multiple "atomic" layers and so each cycle may deposit thicknesses greater than typically found during ALD processes. Precursor effluents are removed from the substrate processing region (i.e., the first layer 110) and then the surface is irradiated before exposing the layer to the deposition precursor again. Still in some embodiments, forming the first layer 110 by ALD may be performed at a temperature level ranging between about 150~300° C.; forming the second layer 112 by MLD may be performed at a temperature level ranging between about 200~450° C. Although there are two dielectric layers formed over the oxide layer 108 according to the present embodiment, any number (less or more than two) of dielectric layers may be formed in a suitable application.

Figure 1D:
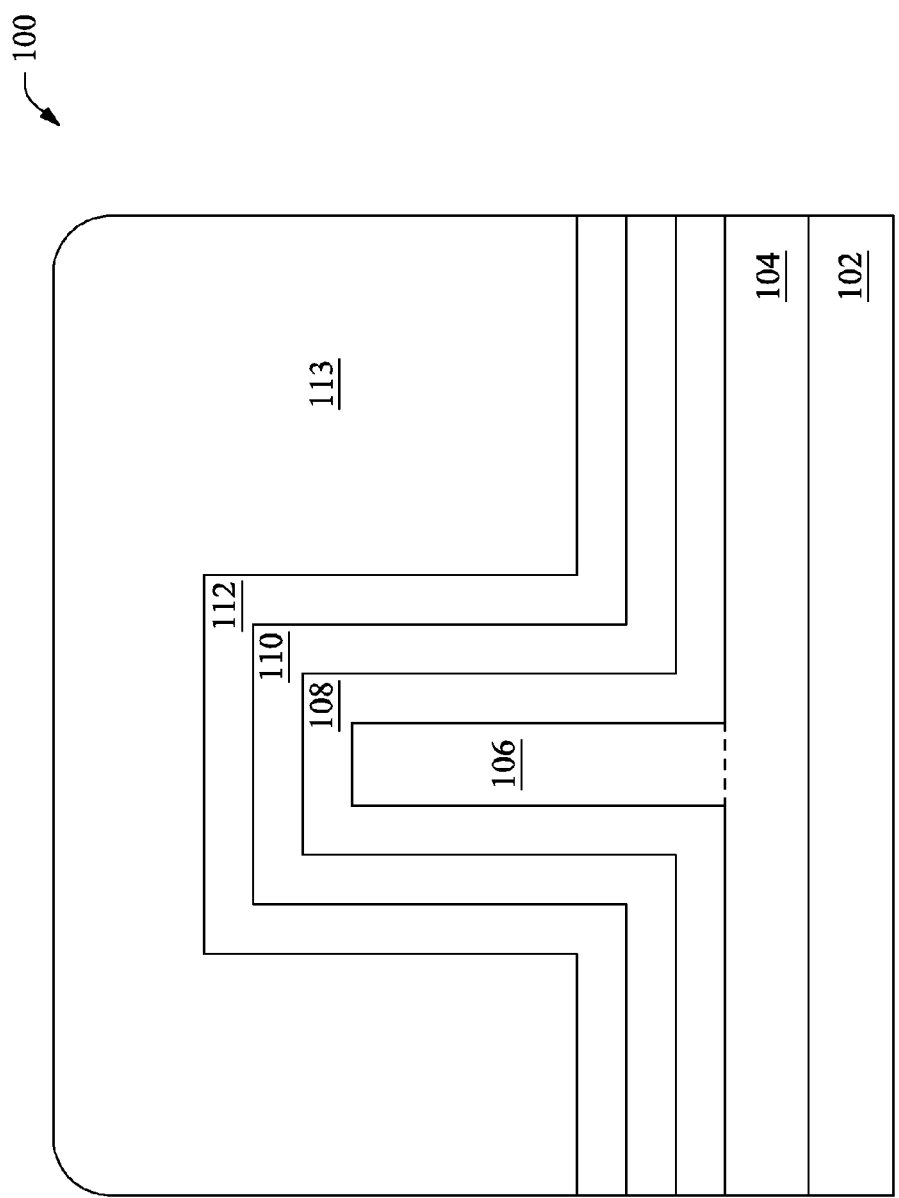

Referring now to FIG. 1D, a third dielectric layer 113 is deposited over the second dielectric layer 112 so as to wrap the fin structure 106 as well. In some examples, the deposition of the third dielectric layer may be implemented using CVD. Although the third dielectric layer may be limited to SiN in the present disclosure, other dielectric materials, such as $SiO_2$, that are able to provide an isolation feature may be used to form the third dielectric layer.

Figure 1E:
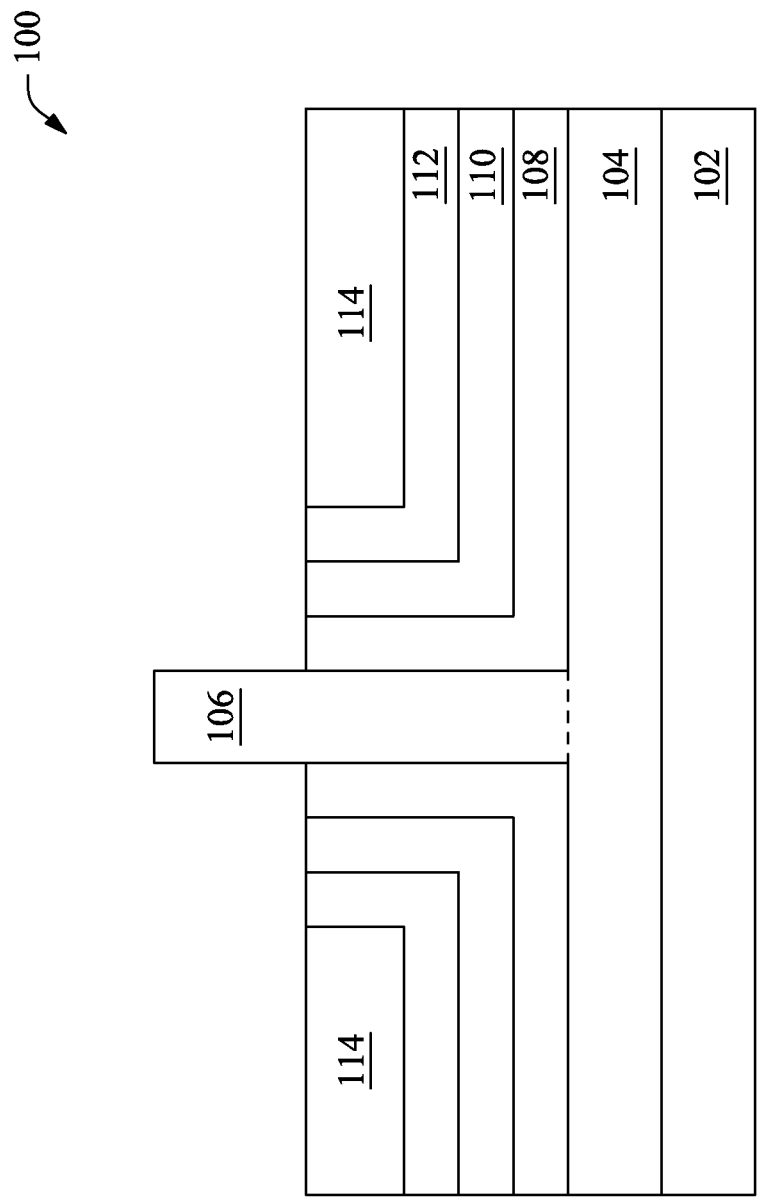

Referring now to FIG. 1E, isolation structures, such as various shallow trench isolation (STI) features 114, are formed over the second dielectric layer 112 so as to wrap part of the fin structure 106. In an embodiment, the STI features 114 are formed by at least one or more of the steps: performing a chemical mechanical polishing (CMP) process on the third dielectric layer 113; depositing a hard mask layer on the polished layer 113; performing a lithography process to form a patterned resist layer on the hard mask layer; etching the hard mask layer using the patterned resist layer as an etch mask so as to expose the upper portion of the fin structure 106 as shown in FIG. 1E.

Generally, the STI feature 114 is a dielectric material configured to isolate the wrapped fin structure 106 from other fin structures on the substrate 102, and/or from nearby features. For examples, the STI 114 may prevent electric current flowing through the fin structure 106 from flowing to another fin structure. In accordance with various embodiments, the STI 114 is formed around the lower portion of the fin structure 106. The upper portion of the fin structure 106 remains exposed. That is, only the lower portion of the fin structure and the surface of the layer 104 are covered by the oxide layer 108.

Figure 1F:
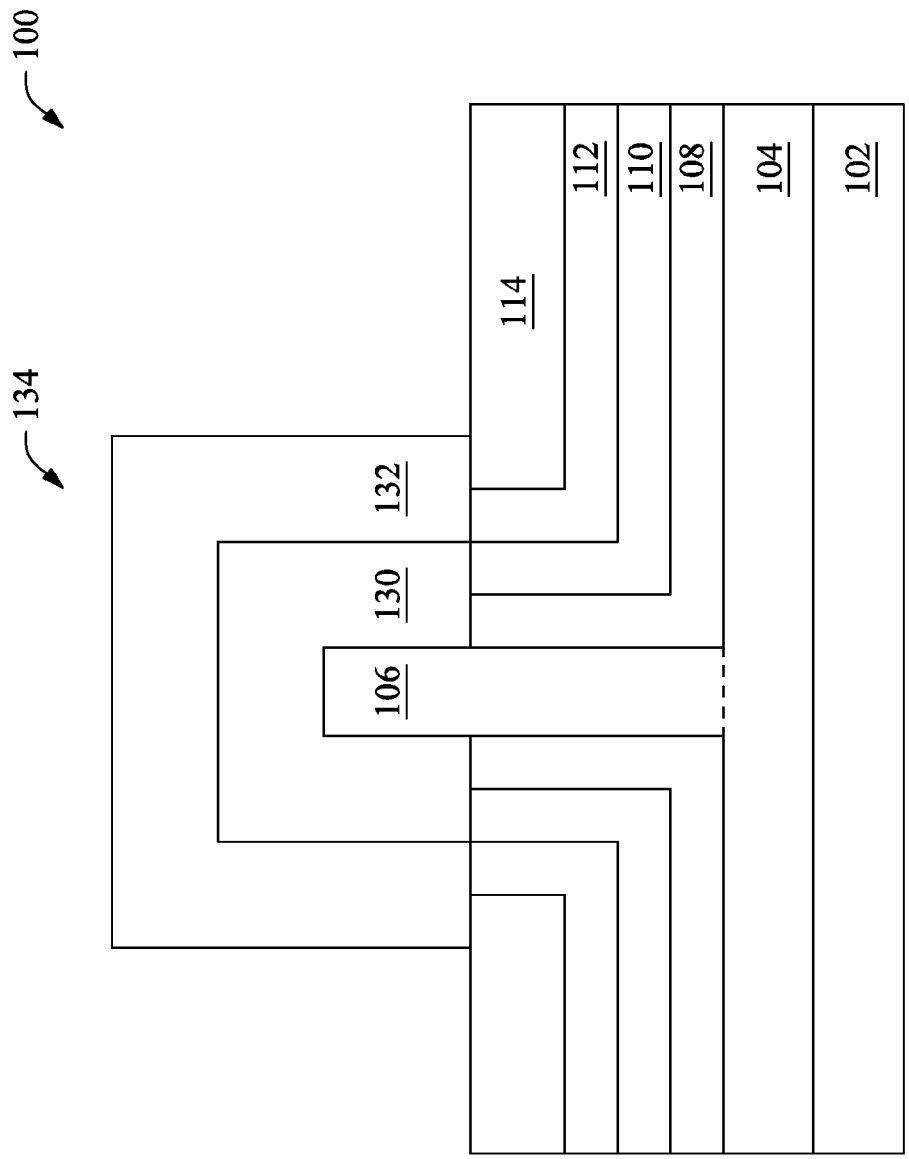

In an embodiment, a gate stack and/or a source/drain may be further formed over the upper portion of the fin structure 106 so as to complete the semiconductor structure 100 as a fin FET. For example, as shown in FIG. 1F, a high-k dielectric layer 130 is formed over the exposed portion of the fin structure 106, and subsequently a gate electrode 132 is formed over the high-k dielectric layer 130 so as to form a gate stack 134.

Figure 2:
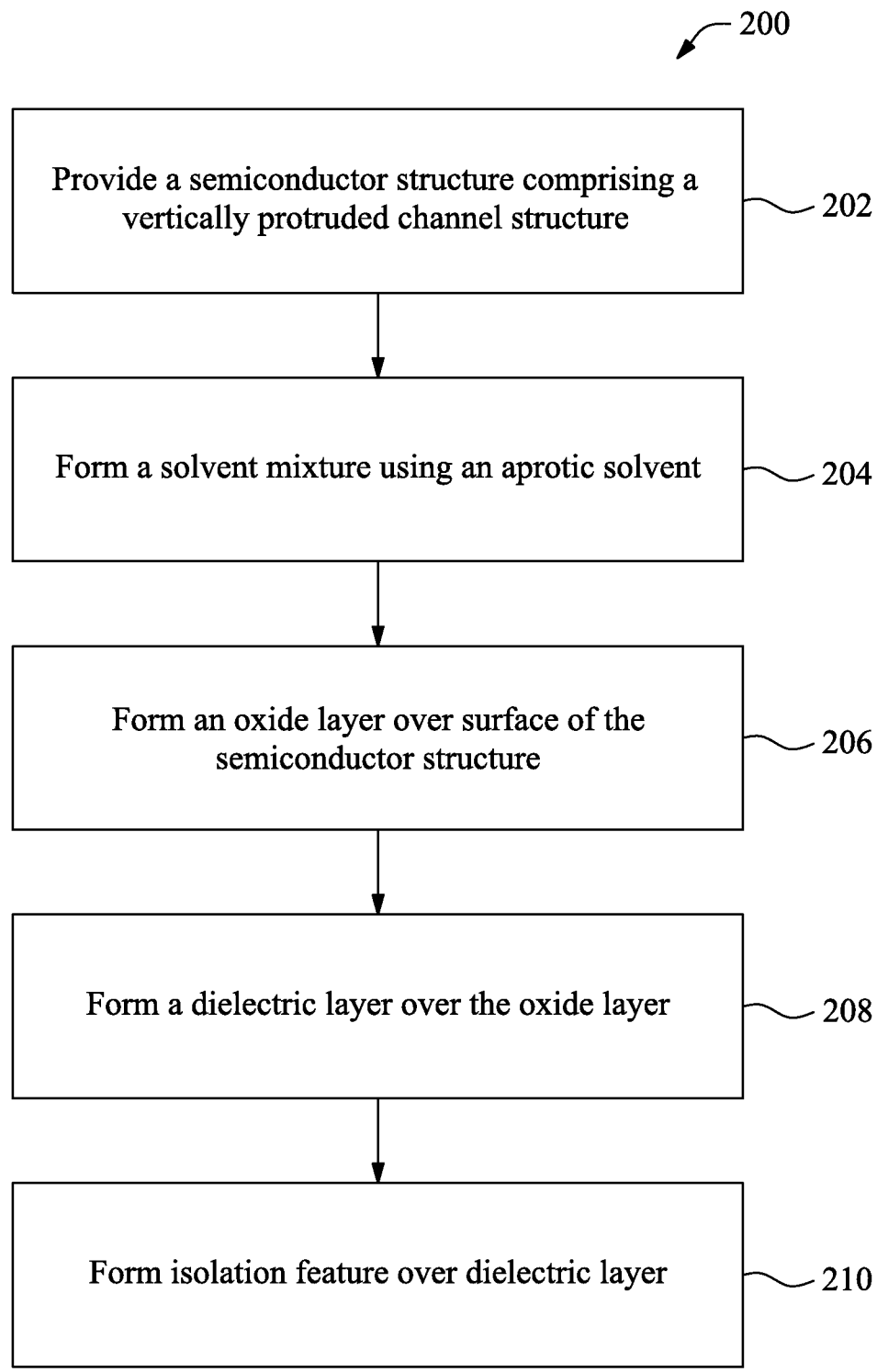
FIG. 2 shows a flow chart to illustrate a method making a semiconductor structure constructed according to various aspects of the present disclosure in accordance with some embodiments.

FIG. 2 shows a flow chart of a method 200 to fabricate a semiconductor structure (e.g., semiconductor structure 100) having a thin oxide layer formed around a semiconductor surface according to various aspects of the present disclosure in some embodiments. The semiconductor structure 100 is provided as an example and is not intended to limit the scope of the method.

The method 200 starts in block 202 with providing a semiconductor structure 100, wherein, as described in FIG. 1A, the semiconductor structure further 100 includes substrate 102, semiconductor layer 104 and fin structure 106. The semiconductor structure 100 may include other fin structures formed of a semiconductor material same as or different from the semiconductor material of 104. However, in accordance with illustrative embodiments, the fin structure 106 and other fin structure(s) are formed of the same semiconductor material as the one of 104, such as Ge, Ge-based, and/or III-V compound semiconductor material. The method 200 continues in block 204 with mixing a water soluble substance with an aprotic solvent to form a solvent mixture.

Subsequently, the method 200 continues in block 206 with forming an oxide layer 108 around the surface of the semiconductor structure 100 by performing wet chemical oxidation operations on the surface with the solvent mixture. In accordance with some embodiments, the oxide layer 108 may cover completely an exposed surface of the semiconductor structure 100, that is, the surface of the fin structure 106 and the top surface of the semiconductor layer 104. In alternative embodiments, the oxide layer 108 may cover a partial surface of the semiconductor structure 100 according to any suitable applications. Referring still to FIG. 2, the method 200 continues in block 208 with forming at least one dielectric layer 110 and/or 112 over the oxide layer 108 before forming isolation feature 114 as described in block 210.

As mentioned above, an insufficient thickness of a formed oxide layer on a semiconductor surface occurs when using a typical water-based solution. By contrast, the present disclosure incorporates an aprotic solvent into a water-based solution to form an aprotic solvent-based solution. This, aprotic solvent-based solution reduces the etching rate of a semiconductor substrate which in turn produces a sufficient thickness of a formed oxide layer thereof.

Figure 3:
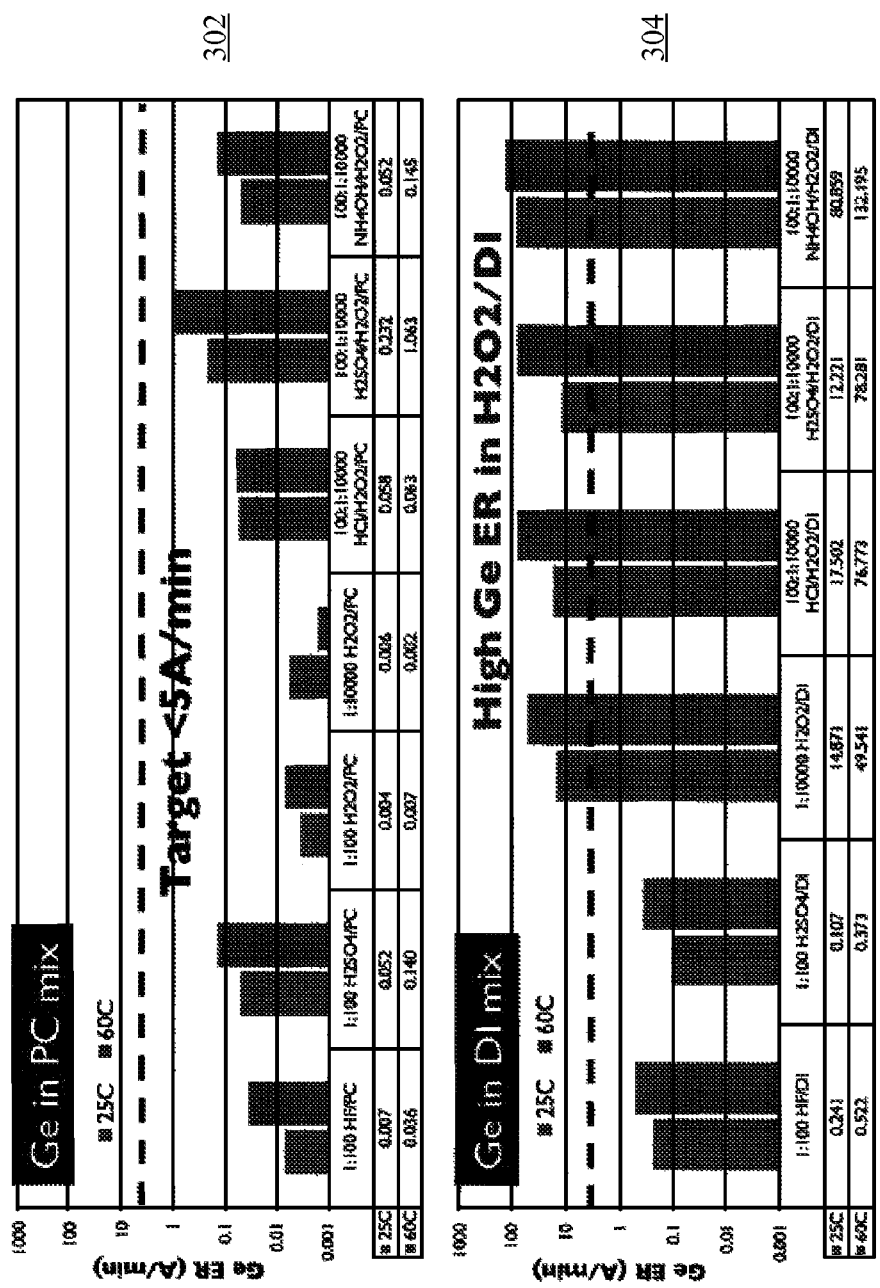
FIG. 3 shows a difference between using solvent- and water-based solutions to perform wet oxidation processes in accordance with various embodiments.

FIG. 3 shows the difference between using an aprotic solvent-based (e.g., PC) and water-based ($H_2O_2$) solution to perform a wet oxidation process in accordance with various embodiments. More particularly, FIG. 3 compares an etching rate of germanium by exposing a germanium surface to a PC mixture (e.g., HF/PC, $H_2SO_4$/PC, $H_2O_2$/PC, HCl/$H_2O_2$/PC, $H_2SO_4$/$H_2O_2$/PC, and $NH_4OH$/$H_2O_2$/PC) and a DI water mixture (e.g., HF/DI, $H_2SO_4$/DI, $H_2O_2$/DI, HCl/$H_2O_2$/DI, $H_2SO_4$/$H_2O_2$/DI, and $NH_4OH$/$H_2O_2$/DI), respectively. Referring back to FIG. 3, upper panel 302 shows the etching rate for each PC mixture. Lower panel 304 shows the etching rate for each DI mixture. As can be seen, the aprotic solvent-based solution reduces the etching rate of the semiconductor substrate (e.g. germanium based substrate here) in comparison to the water based-solution. In some embodiments, a desirable etching rate for a Ge-based substrate is about 5 angstrom/min or less, which means that less than one monolayer of germanium oxide is removed (i.e., etched).

Figure 4:
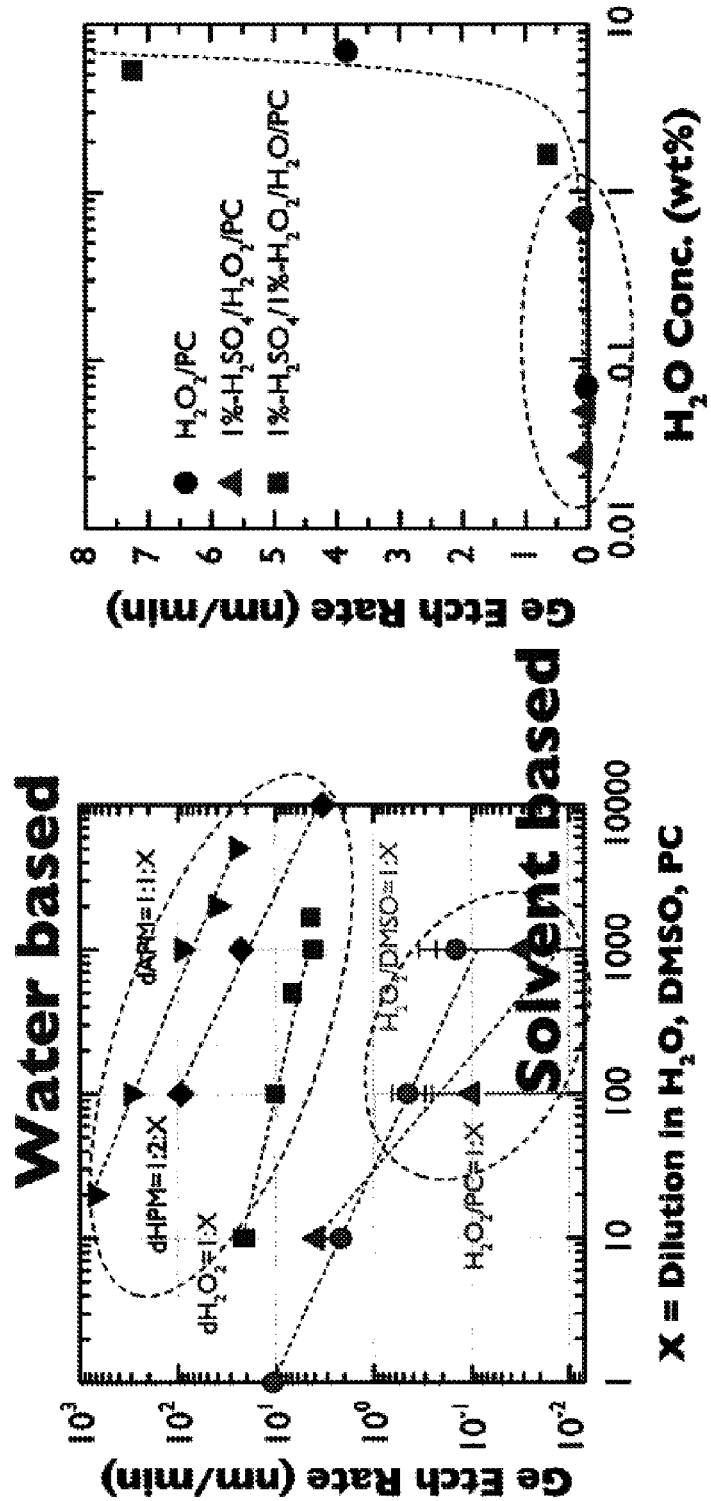
FIG. 4 shows an effect of concentration of water in accordance with various embodiments.

As discussed above, the aprotic-based solution includes one or more aprotic solvents and one or more water-based solution. In one example, the aprotic based solution is a binary mixture that is composed of HF/PC, $H_2SO_4$/PC, or $H_2O_2$/PC. In such a binary mixture, a diluted concentration of PC may range from 1:1 to 1:10,000. In an example of the mixture HF/PC, ratio of HF to PC may range from 1:1 to 1:10,000. In another example, the aprotic mixture is a ternary mixture that is composed of HCl/$H_2O_2$/PC, $H_2SO_4$/$H_2O_2$/PC, or $NH_4OH$/$H_2O_2$/PC. In such a ternary mixture, a diluted concentration of PC may range from 1:1:1 to 1:1:10,000. In an example of the mixture HCl/$H_2O_2$/PC, ratio of HCl to $H_2O_2$ and PC may range from 1:1:1 to 1:1:10,000. As shown, by using the PC mixture, a lower etching rate is reached, which leads to a more stable formation of a germanium-oxide layer (e.g., 108) over the germanium surface (e.g., surface of 104). FIG. 4 shows how concentration of water ($H_2O$) in a solvent mixture affects in accordance with various embodiments. As shown both in left panel 402 and right panel 404, in order to reach a desired (low) etching rate, solvent-based mixture (e.g., PC mixture) and low $H_2O$ concentration play a critical role to reach such a goal.

The present disclosure provides a method and structure of a FET that provide an oxide layer formed over a Ge-based semiconductor surface so as to reach a desired isolation feature. More specifically, such an oxide layer is formed by a wet oxidation process in the use of an aprotic solvent (e.g., PC) mixture. By using such solvent-based mixture, a minimum, yet stable, etching rate may be reached, which causes a thin and stoichiometric oxide layer to be formed. As such, it may be advantageous for an isolation feature formed over the semiconductor surface to perform designated function (e.g., isolation). Further, the disclosed method and structure may be generalized to be implemented on III-V compound semiconductor surface.

The semiconductor structure 100 may be used in various applications, such as logic circuit, dynamic random access memory (DRAM), static random access memory (SRAM) cells, flash memory, or imaging sensor. The semiconductor structure is a fin FET or alternatively a vertical FET or a planer FET.

The present disclosure provides a method in accordance with some embodiments. The method includes forming a fin structure over a semiconductor substrate, forming an oxide layer over the fin structure, wherein forming the oxide layer includes performing a wet chemical oxidation process on the fin structure with a solvent mixture, forming a dielectric layer over the oxide layer, and forming at least one isolation feature over the semiconductor structure.

The present disclosure provides a method in accordance with some embodiments. The method includes mixing a water soluble substance with an aprotic solvent to form a solvent mixture, forming a first oxide layer around a semiconductor surface by performing wet chemical oxidation operations on the semiconductor surface with the solvent mixture, and forming a dielectric layer over the first oxide layer. Further, the semiconductor surface comprises the surface of a channel structure and the surface to be coupled to a shallow trench isolation (STI) feature.

The present disclosure provides a semiconductor structure in accordance with some embodiments. The semiconductor structure includes a substrate comprising a surface that is formed of a semiconductor material, an oxidized layer that is an oxide of the semiconductor material formed, in part, over the surface of the substrate, the layer having been formed by mixing a water soluble substance with an aprotic solvent to form a solvent mixture and performing wet chemical oxidation operations on the surface with the solvent mixture, and a dielectric layer configured to provide an isolation feature is to be formed over the oxidized layer. More particularly, the first semiconductor material comprises one or more of Ge, SiGe, group III, or group IV compound semiconductor material.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method to form a semiconductor structure, comprising:
   forming a fin structure over a semiconductor substrate, the fin structure having a top surface facing away from the semiconductor substrate;
   forming an oxide layer over the fin structure, wherein forming the oxide layer includes performing a wet chemical oxidation process on the fin structure with a solvent mixture;
   removing a portion of the oxide layer to expose the top surface of the fin structure;
   forming a dielectric layer over the oxide layer and directly on the exposed top surface of the fin structure; and
   forming at least one isolation feature over the semiconductor structure, wherein after forming the at least one isolation feature over the semiconductor structure, the at least one isolation feature has a bottom surface facing the semiconductor substrate and the dielectric layer is not disposed under the bottom surface of the at least one isolation feature; and
   forming a first dielectric material layer over the oxide layer, wherein the oxide layer has a first sidewall surface directly interfacing with the fin structure and a second sidewall surface opposite the first sidewall surface, the second sidewall surface directly interfacing with the first dielectric material layer.

2. The method of claim 1, wherein the solvent mixture includes a water soluble substance and an aprotic solvent.

3. The method of claim 2, wherein aprotic solvent comprises one or more of propylene carbonate, dimethyl sulfoxide, ethylene carbonate or diethyl carbonate.

4. The method of claim 2, wherein water soluble substance comprises one or more of $H_2O_2$, $O_3$, $NH_4OH$, HCl, HF, or $H_2SO_4$.

5. The method of claim 1, further comprising forming a second dielectric material layer over the first dielectric material layer.

6. The method of claim 5, wherein the first dielectric material layer is formed of a different material than the second dielectric material layer.

7. The method of claim 1, further comprising forming a gate electrode over the dielectric layer, wherein the dielectric layer includes a high k dielectric material.

8. The method of claim 1, wherein removing the portion of the oxide layer to expose the top surface of the fin structure includes removing another portion of the oxide layer to expose a sidewall surface of the fin structure.

9. A method, comprising:
   providing a substrate including a first semiconductor material;
   forming a semiconductor layer and a fin structure of a second semiconductor material over the substrate,
   forming an oxidized layer that is an oxide of the second semiconductor material over the semiconductor layer and the fin structure, wherein the forming the oxidized layer includes:
      mixing a water soluble substance with an aprotic solvent to form a solvent mixture; and
      performing a wet chemical oxidation operation on a top surface of the semiconductor layer and on the fin structure with the solvent mixture to form the oxidized layer;
   depositing a first dielectric layer over the oxidized layer, wherein the oxidized layer has a first sidewall surface directly interfacing with the fin structure and a second sidewall surface opposite the first sidewall surface, the second sidewall surface directly interfacing with the first dielectric layer;
   forming an isolation feature over the first dielectric layer and exposing an upper portion of the fin structure;
   forming a high-k dielectric layer over the upper portion of the fin structure; and
   forming a gate electrode over the high-k dielectric layer.

10. The method of claim 9, wherein the second semiconductor material is selected from the group consisting of Ge, SiGe, group III, and group IV compound semiconductor material.

11. The method of claim 9, wherein the aprotic solvent comprises one or more of propylene carbonate, dimethyl sulfoxide, ethylene carbonate or diethyl carbonate.

12. The method of claim 9, wherein the water soluble substance comprises one or more of $H_2O_2$, $O_3$, $NH_4OH$, HCl, HF, or $H_2SO_4$.

* * * * *